(12) United States Patent
Pescianschi

(10) Patent No.: US 12,339,550 B2
(45) Date of Patent: Jun. 24, 2025

(54) ACTIVE-MATRIX LCD WITH RESISTIVE MEMORY

(71) Applicant: Dmitri Pescianschi, Quedlinburg (DE)

(72) Inventor: Dmitri Pescianschi, Quedlinburg (DE)

(73) Assignee: LMPU Holding Corp., Old Westbury, NY (US)

( * ) Notice: Subject to any disclaimer, the term of this patent is extended or adjusted under 35 U.S.C. 154(b) by 0 days.

(21) Appl. No.: 18/810,808

(22) Filed: Aug. 21, 2024

(65) Prior Publication Data
US 2025/0068022 A1    Feb. 27, 2025

Related U.S. Application Data

(60) Provisional application No. 63/533,981, filed on Aug. 22, 2023.

(51) Int. Cl.
G02F 1/1365    (2006.01)
H10B 63/00     (2023.01)
H10N 70/20     (2023.01)

(52) U.S. Cl.
CPC .......... *G02F 1/1365* (2013.01); *H10B 63/20* (2023.02); *H10N 70/20* (2023.02)

(58) Field of Classification Search
CPC ........ G02F 1/1365; H10B 63/20; H10N 70/20
See application file for complete search history.

(56) References Cited

U.S. PATENT DOCUMENTS

| | | | |
|---|---|---|---|
| 7,551,471 B2 * | 6/2009 | Yamazaki | G11C 13/0028 365/189.08 |
| 2008/0165302 A1 * | 7/2008 | Yasui | G09G 3/3648 349/48 |
| 2018/0068625 A1 * | 3/2018 | Ho | G09G 3/3659 |

* cited by examiner

*Primary Examiner* — Anne M Hines
(74) *Attorney, Agent, or Firm* — Anna Vishev

(57) ABSTRACT

An active-matrix liquid crystal display (AM LCD), which uses controlled resistors with memory instead of capacitors as memory elements for pixels. The voltage control on the liquid crystal cell is performed by means of a voltage divider on the controlled resistors.

4 Claims, 6 Drawing Sheets

DB : data bus

RSL : row selection line

SEL : select transistor

CAC : charge accumulating capacitor

LC : liquid crystal

ACTIVE-MATRIX LCD WITH RESISTIVE MEMORY

CROSS-REFERENCE TO RELATED APPLICATIONS

This application claims all rights of priority to U.S. Provisional Patent Application No. 63/533,981, filed on Aug. 22, 2023.

FIELD OF INVENTION

The invention relates to the field of electronics, microelectronics, optoelectronics, information processing and conversion.

BACKGROUND OF THE INVENTION

To improve the visualization quality of liquid crystal displays, the passive liquid crystal matrix is replaced by an active liquid crystal matrix (AM LCD). A typical schematic of an individual AM LCD pixel is shown in FIG. 1.

As shown in FIG. 2, selecting the active row of liquid crystal cells (Ri) opens the capacitors to write the voltages (Dj) that encode the transparency of the cells. Selecting the next row and turning off the current row does not disable the cells, since the necessary voltage level is stored in the capacitors. This scheme of the active matrix leads to a significant increase in image quality. However, it is not without disadvantages. For example, the capacitors are subject to a fairly rapid leakage of charge. This requires constant regeneration, which is extremely difficult when storing analog information. In addition, this approach does not eliminate line-by-line, which still preserves the effect of screen flicker.

SUMMARY

In its general aspect, the invention is an active-matrix liquid crystal display (AM LCD), which uses controlled resistors with memory instead of capacitors as memory elements for pixels. The voltage control on the liquid crystal cell is performed by means of a voltage divider on the controlled resistors.

BRIEF DESCRIPTION OF THE DRAWINGS

The invention is illustrated by way of examples which are not a limitation, and the figures of the accompanying drawings in which references denote corresponding parts, and in which.

DESCRIPTION OF THE INVENTION

In accordance with the preferred embodiment of the present invention, a change from using unreliable capacitors to using a reliable voltage divider on controllable resistors with memory is proposed for controlling liquid crystals. A liquid crystal display is based on an active matrix, wherein each liquid crystal (LC) cell is controlled by a voltage supplied from a Resistive Voltage Divider with Memory (MRVD). The memory stores the value of the divider resistances that determines the voltage controlling the liquid crystal (LC) cell.

Figure 1:
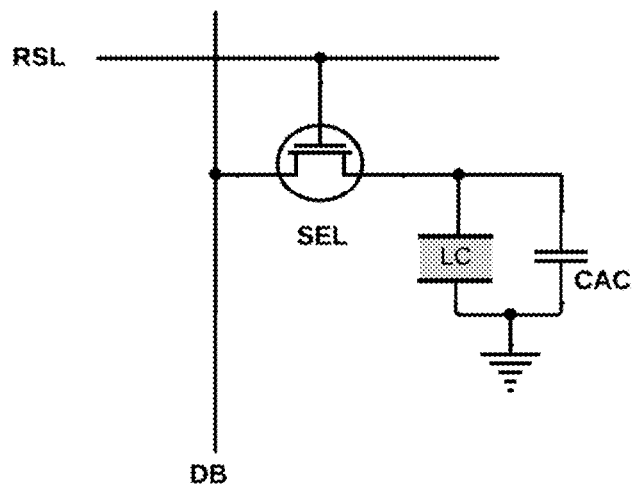
FIG. 1 shows a prior art circuit diagram of an AM LCD cell.
Figure 2:
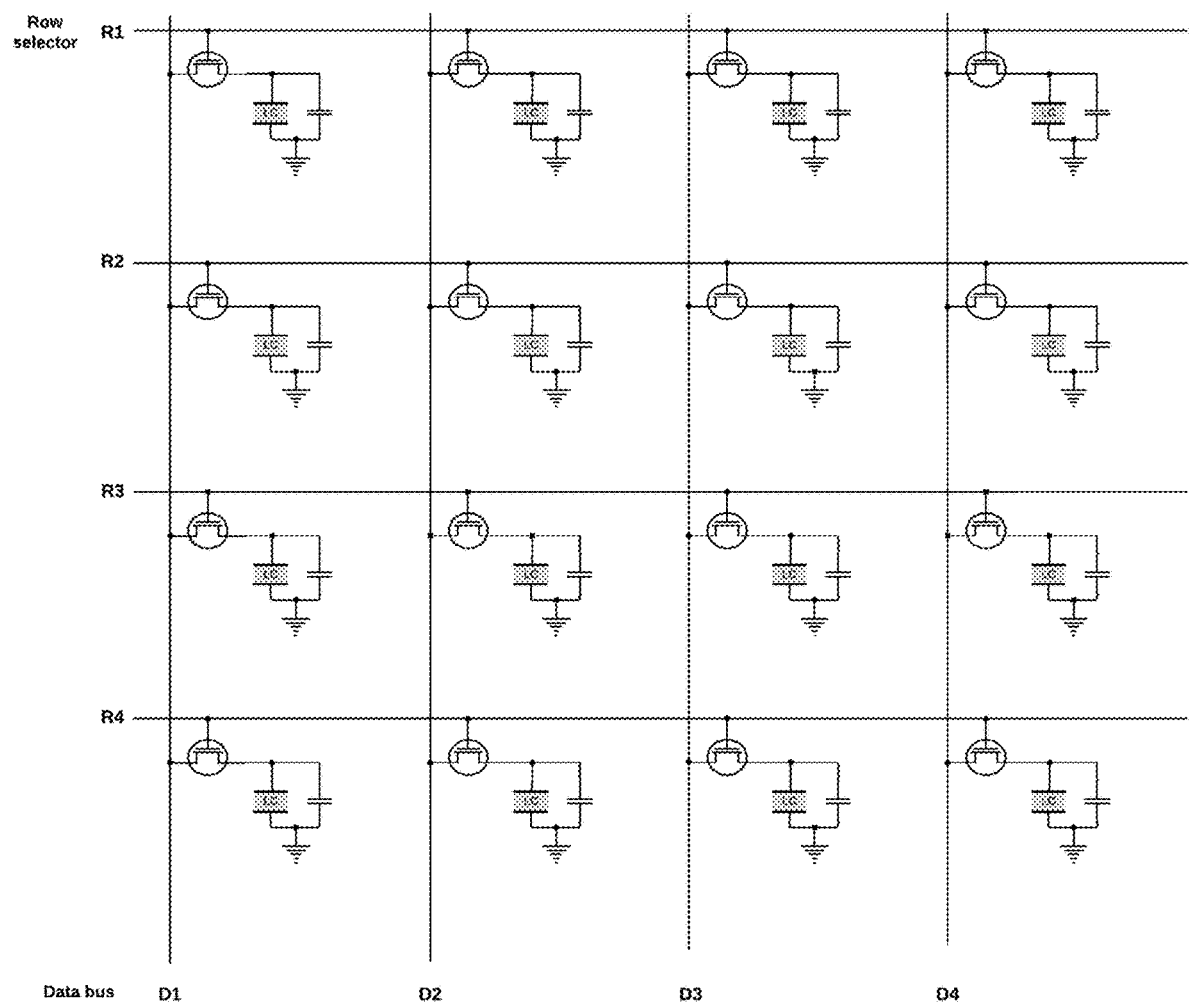
FIG. 2 shows schematics of a prior art AM LCD.
Figure 3:
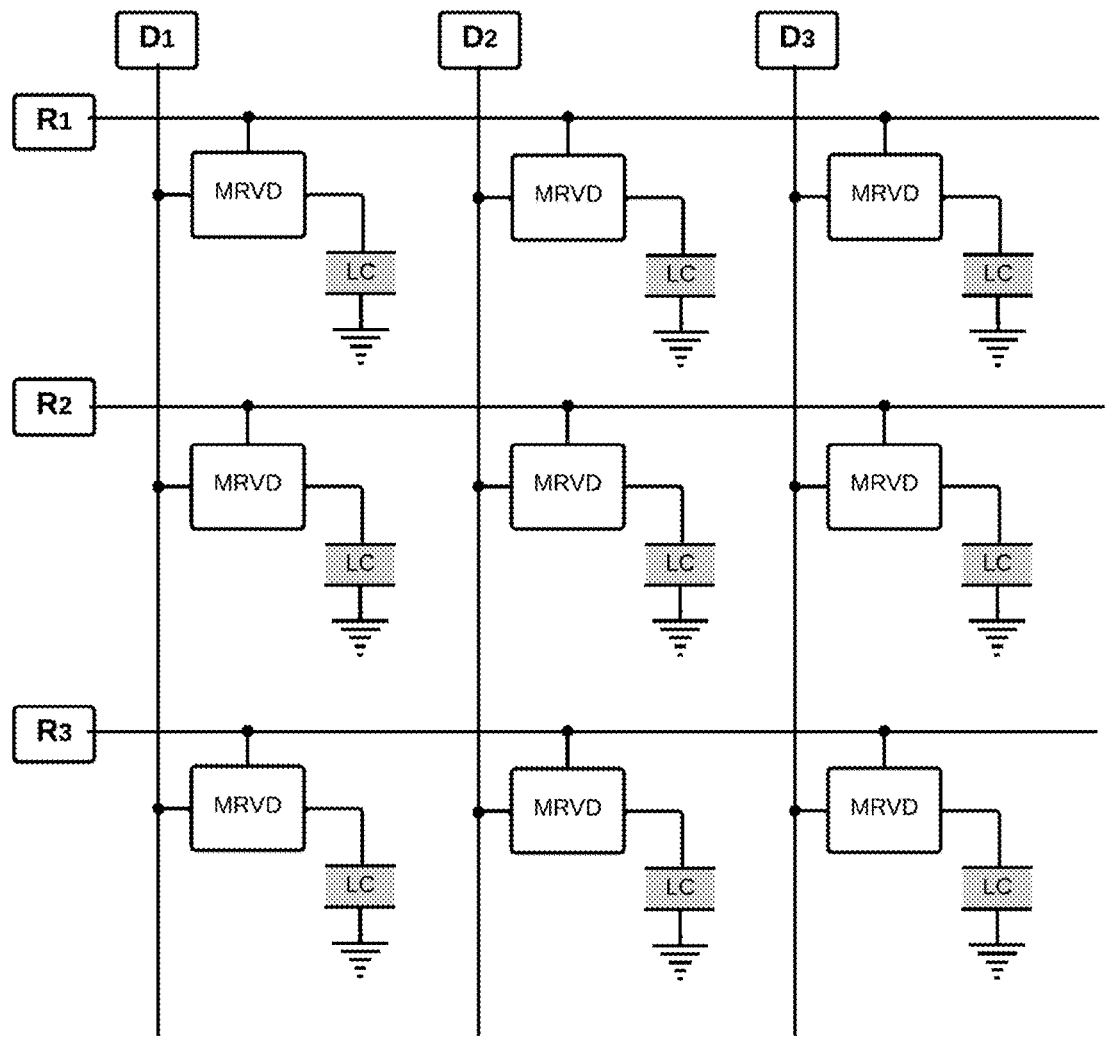
FIG. 3 shows schematics of LC's with MRVD in accordance with the preferred embodiment of the present invention.

The preferred embodiment is illustrated in FIG. 3, where Ri is the address channel, Dj is the data channel, MRVD is the Resistive Voltage Divider with Memory, and LC is the Liquid Crystal Cell.

Figure 4:
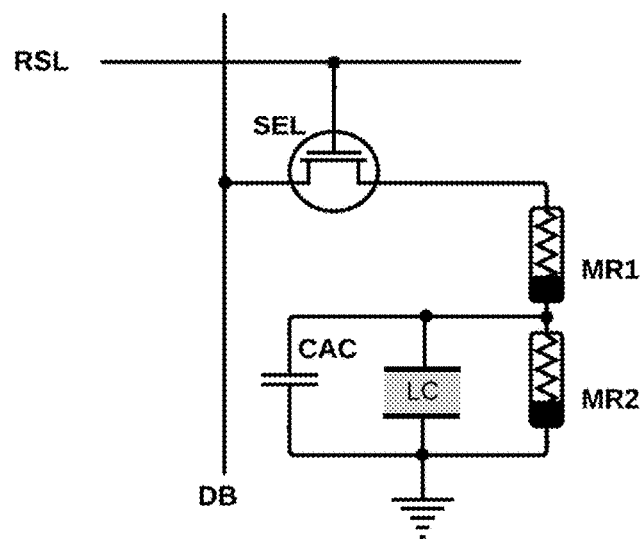
FIG. 4 shows a circuit diagram of an Memristor Memory LCD cell.

The liquid crystal display preferably uses memristors as controllable memory resistors as illustrated in FIG. 4. In this case, one possible example of a display circuit would be the following, where the operation of the memristors is possible in two modes: write and read, where in the write mode, the address channel (Ri) selects the line to be written and the data channel (Dj) supplies a voltage correcting the resistances of the memristors, while in the read mode, all address channels (Ri) can be opened simultaneously and the same signal can be supplied to all data channels (Dj), which will be transformed in each cell individually, according to the personal values of the resistances of the memristors of the voltage divider, resulting in the formation of an image.

Figure 5:
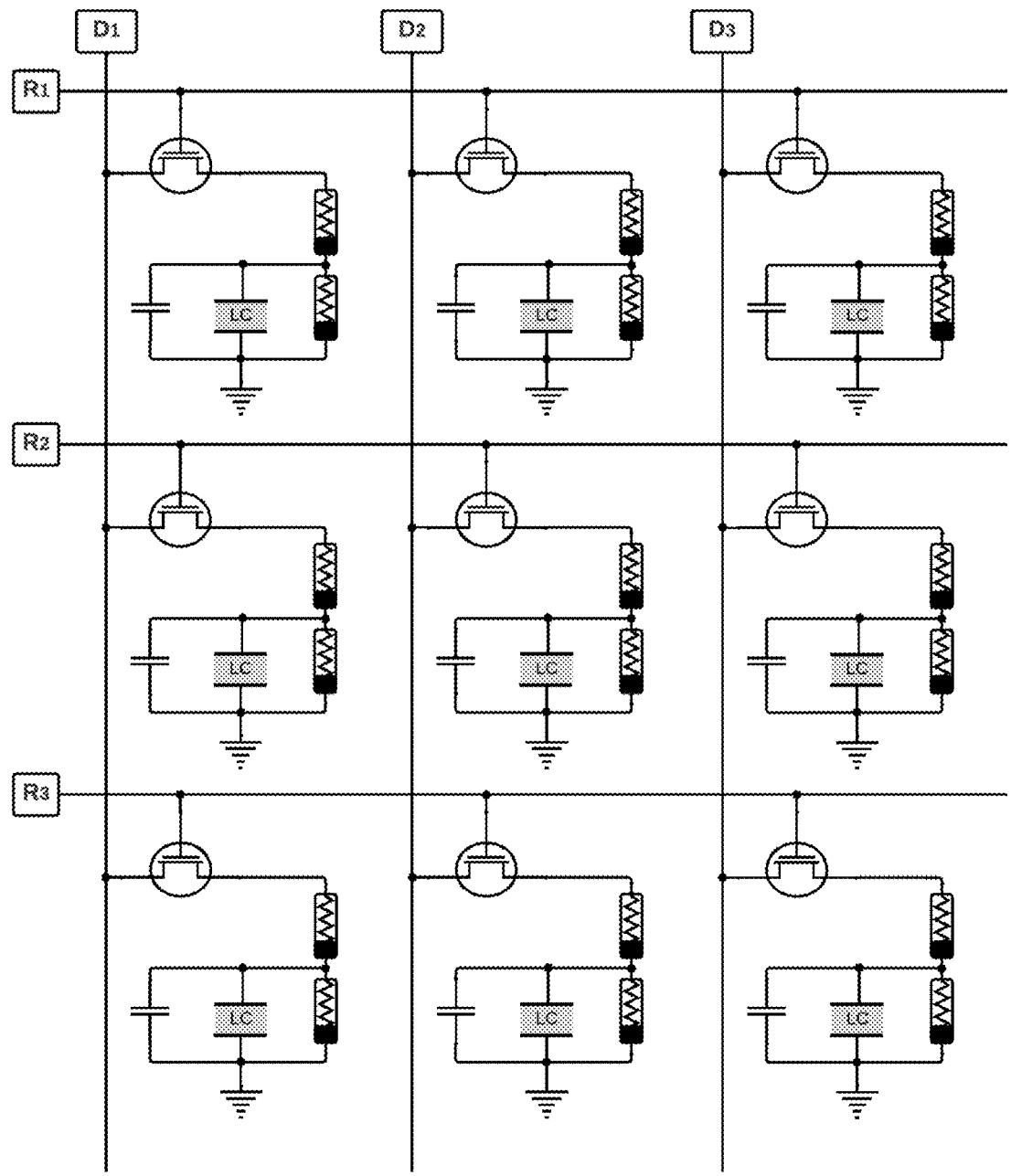
FIG. 5 shows schematics of a Memristor Memory LCD.

The schematics of the Memristor Memory LCD is illustrated in FIG. 5, where Ri is the address channel; Dj is the data channel; and LC is the liquid crystal cell.

The next preferred embodiment of the present invention is similar to the embodiment described above, but instead of utilizing memristors, this embodiment comprises elements utilizing a magneto-resistive effect, that is, utilizing magneto-resistive elements, wherein the memory is stored in the form of magnetic domains controlling the resistance of the elements as controllable memory resistors.

Figure 6:
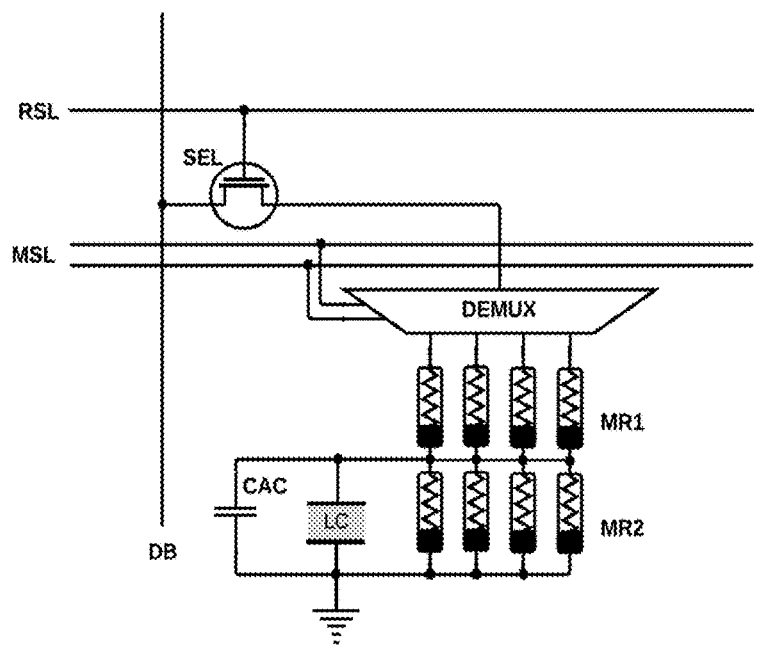
FIG. 6 shows a circuit diagram of a Multiple Memristor Memory LCD cell.

In another preferred embodiment illustrated in FIG. 6, the present invention utilizes a bundle of index-addressable controllable resistors as a memory, which allows not just one image but many images to be stored in the memory and allows switching between images by simply selecting the index of resistors from the bundle, as for example in one of the possible memristor-based circuits demonstrated in FIG. 6.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

I claim:

1. A liquid crystal display based on an active matrix, said liquid crystal display comprising:
   at least one liquid crystal cell; and
   a resistive voltage divider with a memory,
   wherein the at least one liquid crystal cell is controlled by a voltage supplied from the resistive voltage divider with the memory; and wherein the memory stores the value of a divider resistances that determines the voltage controlling the liquid crystal cell.

2. The liquid crystal display in accordance with claim 1, further comprising memristors as controllable memory resistors.

3. The liquid crystal display in accordance with claim 1, further comprising magneto-resistive elements, wherein the memory is stored in a form of magnetic domains controlling resistance of the magneto-resistive elements as controllable memory resistors.

4. The liquid crystal display in accordance with claim 1, wherein the memory comprises a bundle of index-addressable controllable resistors.

* * * * *